(12) United States Patent
Lin et al.

(10) Patent No.: US 9,831,133 B2
(45) Date of Patent: Nov. 28, 2017

(54) SEMICONDUCTOR DEVICES HAVING METAL GATE AND METHOD FOR MANUFACTURING SEMICONDUCTOR DEVICES HAVING METAL GATE

(71) Applicant: UNITED MICROELECTRONICS CORP., Hsin-Chu (TW)

(72) Inventors: Chao-Hung Lin, Changhua County (TW); Chih-Kai Hsu, Tainan (TW); Li-Wei Feng, Kaohsiung (TW); Shih-Hung Tsai, Tainan (TW); Chien-Ting Lin, Hsinchu (TW); Jyh-Shyang Jenq, Pingtung County (TW); Ching-Wen Hung, Tainan (TW); Jia-Rong Wu, Kaohsiung (TW); Yi-Hui Lee, Taipei (TW); Ying-Cheng Liu, Tainan (TW); Yi-Kuan Wu, Kaohsiung (TW); Chih-Sen Huang, Tainan (TW); Yi-Wei Chen, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/352,605

(22) Filed: Nov. 16, 2016

(65) Prior Publication Data
US 2017/0062282 A1  Mar. 2, 2017

Related U.S. Application Data

(62) Division of application No. 14/834,439, filed on Aug. 25, 2015, now Pat. No. 9,530,778.

(30) Foreign Application Priority Data

Jul. 27, 2015 (CN) .......................... 2015 1 0445767

(51) Int. Cl.
*H01L 21/00* (2006.01)
*H01L 21/8238* (2006.01)
(Continued)

(52) U.S. Cl.
CPC ................ *H01L 21/823842* (2013.01); *H01L 21/28088* (2013.01); *H01L 27/092* (2013.01);
(Continued)

(58) Field of Classification Search
CPC ....... H01L 21/823842; H01L 21/28088; H01L 27/0922
See application file for complete search history.

(56) References Cited

U.S. PATENT DOCUMENTS 7,803,687 B2   9/2010 Chiu et al.
7,858,484 B2  12/2010 Mizumura
(Continued)

*Primary Examiner* — Laura Menz
(74) *Attorney, Agent, or Firm* — Winston Hsu

(57) ABSTRACT

A method for manufacturing semiconductor devices having metal gate includes follow steps. A substrate including a plurality of isolation structures is provided. A first nFET device and a second nFET device are formed on the substrate. The first nFET device includes a first gate trench and the second nFET includes a second gate trench. A third bottom barrier layer is formed in the first gate trench and a third p-work function metal layer is formed in the second gate trench, simultaneously. The third bottom barrier layer and the third p-work function metal layer include a same material. An n-work function metal layer is formed in the first gate trench and the second gate trench. The n-work function metal layer in the first gate trench directly contacts the third bottom barrier layer, and the n-work function metal layer in the second gate trench directly contacts the third p-work function metal layer.

8 Claims, 12 Drawing Sheets

(51) Int. Cl.
*H01L 27/092* (2006.01)
*H01L 29/51* (2006.01)
*H01L 21/28* (2006.01)

(52) U.S. Cl.
CPC ........ *H01L 27/0922* (2013.01); *H01L 29/511* (2013.01); *H01L 29/517* (2013.01)

(56) References Cited

U.S. PATENT DOCUMENTS

| | | | |
|---|---|---|---|
| 8,278,173 B2 | 10/2012 | Lim et al. | |
| 8,569,128 B2* | 10/2013 | Shifren | H01L 21/823807 |
| | | | 257/369 |
| 8,637,936 B2 | 1/2014 | Chiu et al. | |
| 8,692,334 B2 | 4/2014 | Chiou et al. | |
| 9,012,319 B1* | 4/2015 | Choi | H01L 21/28158 |
| | | | 438/591 |
| 9,443,726 B1* | 9/2016 | Li | H01L 21/31051 |
| 9,530,778 B1* | 12/2016 | Lin | H01L 27/0922 |
| 9,627,380 B2* | 4/2017 | Kim | H01L 27/092 |
| 9,685,520 B1* | 6/2017 | Hsu | H01L 29/4236 |
| 2010/0052070 A1* | 3/2010 | Chung | H01L 21/823842 |
| | | | 257/369 |
| 2010/0127336 A1 | 5/2010 | Chambers et al. | |
| 2011/0147853 A1 | 6/2011 | Lin et al. | |
| 2012/0146159 A1* | 6/2012 | Wang | G03F 7/70633 |
| | | | 257/410 |
| 2012/0196425 A1 | 8/2012 | Scheiper et al. | |
| 2012/0256276 A1 | 10/2012 | Hwang et al. | |
| 2012/0319198 A1 | 12/2012 | Chien et al. | |
| 2013/0102145 A1 | 4/2013 | Huang et al. | |
| 2013/0168816 A1 | 7/2013 | Kang et al. | |
| 2013/0203230 A1 | 8/2013 | Chen et al. | |
| 2013/0235652 A1* | 9/2013 | Liaw | H01L 27/0207 |
| | | | 365/156 |
| 2013/0313648 A1* | 11/2013 | Chiang | H01L 27/088 |
| | | | 257/368 |
| 2013/0320412 A1* | 12/2013 | Yamasaki | H01L 21/823842 |
| | | | 257/288 |
| 2014/0027857 A1* | 1/2014 | Yin | H01L 27/088 |
| | | | 257/368 |
| 2014/0252423 A1* | 9/2014 | Tsao | H01L 29/66545 |
| | | | 257/288 |
| 2015/0129973 A1* | 5/2015 | Ji | H01L 27/0922 |
| | | | 257/369 |
| 2016/0071944 A1* | 3/2016 | Lu | H01L 29/42376 |
| | | | 257/392 |
| 2016/0093535 A1* | 3/2016 | Xu | H01L 21/02244 |
| | | | 257/392 |
| 2016/0093616 A1* | 3/2016 | Lai | H01L 21/28088 |
| | | | 257/369 |
| 2016/0268125 A1* | 9/2016 | Li | H01L 21/31051 |
| 2016/0276224 A1* | 9/2016 | Gan | H01L 21/823842 |
| 2016/0336194 A1* | 11/2016 | Yeh | H01L 21/823821 |
| 2017/0162675 A1* | 6/2017 | Yim | H01L 21/0217 |

* cited by examiner

SEMICONDUCTOR DEVICES HAVING METAL GATE AND METHOD FOR MANUFACTURING SEMICONDUCTOR DEVICES HAVING METAL GATE

CROSS REFERENCE TO RELATED APPLICATIONS

This application is a division of U.S. application Ser. No. 14/834,439 filed on Aug. 25, 2015, and incorporated herein by reference in its entirety.

BACKGROUND OF THE INVENTION

1. Field of the Invention

The invention relates to semiconductor devices having metal gate and a manufacturing method thereof, and more particularly, to integrated semiconductor devices having metal gate and a manufacturing method thereof.

2. Description of the Prior Art

With rapid advancement of semiconductor fabricating technology, the integration level of integrated circuits (ICs) is bound to increase continuously in order to improve the device speed and performance and to comply with current requirements for light weight, slimness, and compactness. Improvement of the integration level is inevitably relies on reducing size of feature patterns and pitches between features patterns which construct the devices and ICs. However, size and/or pitch reduction increases difficulty and complexity of device productions.

On the other hand, field effect transistor (hereinafter abbreviated as FET) devices are essential elements of the IC(s) and parameters of the FET devices such as drain-source on resistance (RDson), drain-source breakdown voltage (BVds), and threshold voltage (Vt) significantly influence operation and performance of the FET devices. Furthermore, IC(s) may be constructed by devices of different threshold voltages or different breakdown voltages, and thus requirement of multi-function is complied.

Therefore it is always in need to build up IC(s) including not only superior performance, but also superior multi-functionalities.

SUMMARY OF THE INVENTION

According to an aspect of the present invention, semiconductor devices having metal gate are provided. The semiconductor devices having metal gates include a substrate and a plurality of isolation structures formed therein. And a first nFET device and a second nFET device are formed on the substrate. The first nFET device includes a first n type metal gate (n-metal gate), and the first n-metal gate includes a third bottom barrier layer and an n type work function metal layer (n-work function metal layer). The n-work function metal layer directly contacts the third bottom barrier layer. The second nFET device includes a second n-metal gate and the second n-metal gate includes a second bottom barrier layer, the n-work function metal layer, and a third p-work function metal layer sandwiched between the second bottom barrier layer and the n-work function metal layer. The third p-work function metal layer of the second nFET device and the third bottom barrier layer of the first nFET device include a same material.

According to an aspect of the present invention, a method for manufacturing semiconductor devices having metal gate is provided. The method includes follow steps. A substrate including a plurality of isolation structures formed therein is provided. And a first nFET device and a second nFET device are formed on the substrate. The first nFET device includes a first gate trench and the second nFET includes a second gate trench. Next, a third bottom barrier layer is formed in the first gate trench and a third p-work function metal layer is formed in the second gate trench, simultaneously. The third bottom barrier layer and the third p-work function metal layer include a same material. Then, an n-work function metal layer is formed in the first gate trench and the second gate trench. The n-work function metal layer in the first gate trench directly contacts the third bottom barrier layer, and the n-work function metal layer in the second gate trench directly contacts the third p-work function metal layer.

According to the semiconductors having metal gate and manufacturing method thereof provided by the present invention, different metal layers are associated to provide different threshold voltages for FET devices of the same conductivity type and thus requirement for different functions is complied. In other words, the semiconductors having metal gate and manufacturing method thereof provided by the present invention is able to improve functionalities and performances without increasing process complexity.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-12 are schematic drawings illustrating a method for manufacturing semiconductor devices having metal gate provided by a preferred embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing illustrating a modification to the preferred embodiment, FIG. 9 is a schematic drawing in a step subsequent to FIG. 7, FIG. 10 is a schematic drawing in a step subsequent to FIG. 9, FIG. 11 is a schematic drawing in a step subsequent to FIG. 10, and FIG. 12 is a schematic drawing illustrating the modification in a step subsequent to FIG. 8.

DETAILED DESCRIPTION

Figure 1:
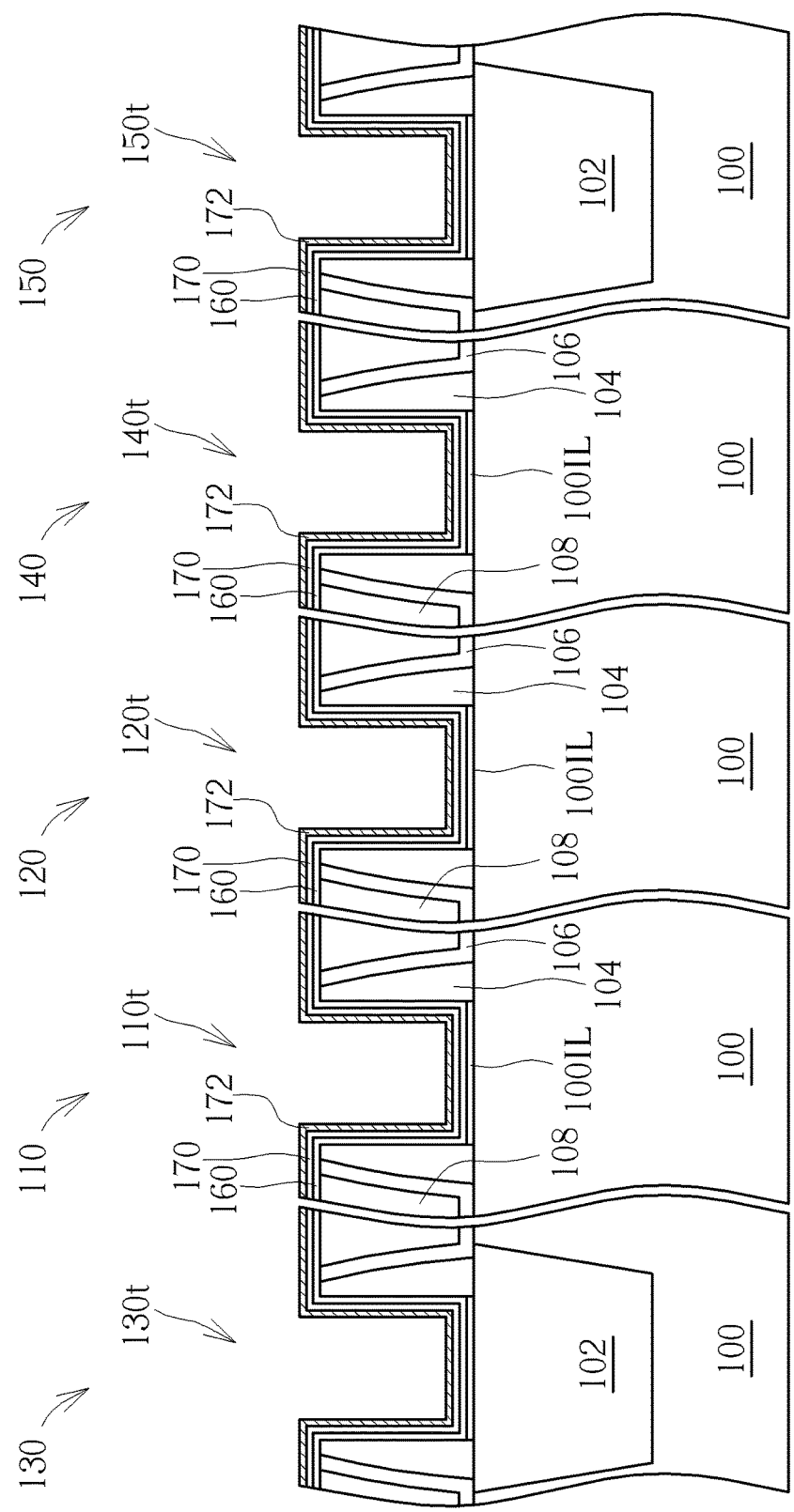

Please refer to FIGS. 1-12, which are schematic drawings illustrating a method for manufacturing semiconductor devices having metal gate provided by a preferred embodiment of the present invention. As shown in FIG. 1, a substrate 100 such as a silicon substrate, a silicon-containing substrate, or a silicon-on-insulator (SOI) substrate is provided. And a plurality of isolation structures 102 are formed in the substrate 100. The isolation structures 102 may include shallow trench isolations (hereinafter abbreviated as STIs). The STIs are used to define a plurality of active regions for accommodating p-typed FET (hereinafter abbreviated as pFET) devices and n-typed FET (hereinafter abbreviated as nFET) devices, and to provide electrical isolation. In the preferred embodiment, a semiconductor layer such as a fin structure involved in fin field effect transistor (FinFET) approach can be provided. The fin structure can be formed by patterning a single crystalline silicon layer of a SOI substrate or a bulk silicon substrate by photolithographic etching pattern (PEP) method, multi patterning method, or, preferably, spacer self-aligned double-patterning (SADP), also known as sidewall image transfer (SIT) method. And the fin structure can be taken as the substrate 100 in the preferred embodiment. At least a first nFET device 110, a second nFET device 120, a third nFET device 130, a first pFET device 140, and a second pFET device 150 are formed on the substrate 100. In the preferred embodiment, a portion of a gate of the third nFET device 130 can be formed on the isolation structure 102 as shown in FIG. 1. Furthermore, the portion of the gate of the third nFET device 130 is formed to cross the isolation structure 102, but not limited to this. Additionally, a portion of a gate of the second pFET device 150 can be formed to cross the isolation structure 102 in accordance with the preferred embodiment, but not limited to this. It should be noted that in the preferred embodiment, the nFET/pFET devices can be devices formed in the same region but required to provide different performances (high or low performance). Therefore, different threshold voltages and saturation currents may be required by those nFET/pFET devices. However those nFET/pFET devices can be devices formed on different regions and thus including different breakdown voltages. Briefly speaking, the first nFET device 110, the second nFET device 120, the third nFET device 130, the first pFET device 140, and the second pFET device 150 are integrated according to a product requirement, and it can be adjusted depending on different product requirements. For example but not limited to this, in the preferred embodiment, the first nFET device 110 requires lower threshold voltage while the second nFET device 120 and the first pFET device 140 require higher threshold voltages.

It is well-known to those skilled in the art that the abovementioned FET devices include a dummy gate or a replacement gate (not shown) such as a polysilicon layer or an amorphous silicon layer, and a patterned hard mask (not shown). Additionally, a dielectric layer 100IL is provided between the substrate 100 and the dummy gates of the first nFET device 110, the second nFET device 120 and the first pFET device 140 in the active region of the substrate 100. The dielectric layer 100IL can be a conventional dielectric layer such as silicon dioxide, but not limited to this. A thickness of the dielectric layer 100IL can be between 7 angstrom (Å) and 13 Å, but not limited to this. Each of the FET devices can include lightly doped drains (LDDs) (not shown), spacers 104 formed on sidewall of the dummy gate, and a source/drain (not shown). The spacers 104 can be multi-layered structures, but not limited to this. Furthermore, selective strain scheme (SSS) can be used to improve device performance in the preferred embodiment. For example, a selective epitaxial growth (SEG) method can be used to form the source/drain. In the pFET devices 140, epitaxial silicon layers of SiGe are used to form the source/drain, and in the nFET devices 110 and 120, epitaxial silicon layers of SiC or SiP are used to form the source/drain. Additionally, salicides (not shown) can be formed on the source/drain. After forming the abovementioned FET devices, a contact etch stop layer (hereinafter abbreviated as CESL) 106 is formed on the semiconductor layer/the substrate 100, and an inter-layer dielectric (hereinafter abbreviated as ILD) layer 108 is subsequently formed.

Please still refer to FIG. 1. Next, a planarization process such as chemical mechanical polishing (CMP) process is performed to planarize the ILD layer 108 and the CESL 106. Furthermore, the planarization process is performed to remove the patterned hard mask, such that the dummy gates are all exposed. The dummy gates of the FET devices are then removed to simultaneously form a first gate trench 110t in the first nFET device 110, a second gate trench 120t in the second nFET device 120, a third gate trench 130t in the third nFET device 130, a fourth gate trench 140t in the first pFET device 140, and a fifth gate trench 150t in the second pFET device 150. Subsequently, a high-k gate dielectric layer 160, a first bottom barrier layer 170 and a second bottom barrier layer 172 are formed in the first gate trench 110t, the second gate trench 120t, the third gate trench 130t, the fourth gate trench 140t, and the fifth gate trench 150t, sequentially.

In the preferred embodiment, the high-k gate dielectric layer 160 is formed to replace the conventional silicon oxide for decreasing physical limit thickness, reducing leakage current, and obtaining equivalent capacitor in an identical equivalent oxide thickness (EOT). The high-k gate dielectric layer 160 can include high-k material selected from the group consisting of silicon nitride (SiN), silicon oxynitride (SiON) and metal oxide. And the metal oxide can include hafnium oxide (HfO), hafnium silicon oxide (HfSiO), hafnium silicon oxynitride (HfSiON), aluminum oxide (AlO), lanthanum oxide (LaO), lanthanum aluminum oxide (LaAlO), tantalum oxide (TaO), zirconium oxide (ZrO), strontium zirconium silicon oxide (ZrSiO), or hafnium zirconium oxide (HfZrO), but not limited to this. A thickness of the high-k gate dielectric layer 160 can be between 14 Å, and 26 Å, but not limited to this. It is therefore understood that the preferred embodiment is to integrate the high-k last approach, but not limited to this. In the high-k last approach, the dielectric layer 100IL originally formed in the gate trenches 110t-150t serves as an interfacial layer (IL), and the interfacial layer 100IL provides a superior interface between the substrate 100 and the high-k gate dielectric layer 160. In a modification to the preferred embodiment, the dielectric layer can be removed from the gate trenches 110t-150t and an interfacial layer 100IL can be formed. Furthermore, in another modification to the preferred embodiment, it can be integrated with high-k first approach. And in the high-k first approach, the dielectric layer can include the abovementioned high-k material, but not limited to this.

According to the preferred embodiment, the first bottom barrier layer 170 can include a titanium nitride (hereinafter abbreviated as TiN) layer, and the second bottom barrier layer 172 can include a tantalum nitride (hereinafter abbreviated as TaN) layer. A thickness of the first bottom barrier layer 170 and a thickness of the second bottom barrier layer 172 respectively can be between 10 Å and 20 Å, but not limited to this.

Figure 2:
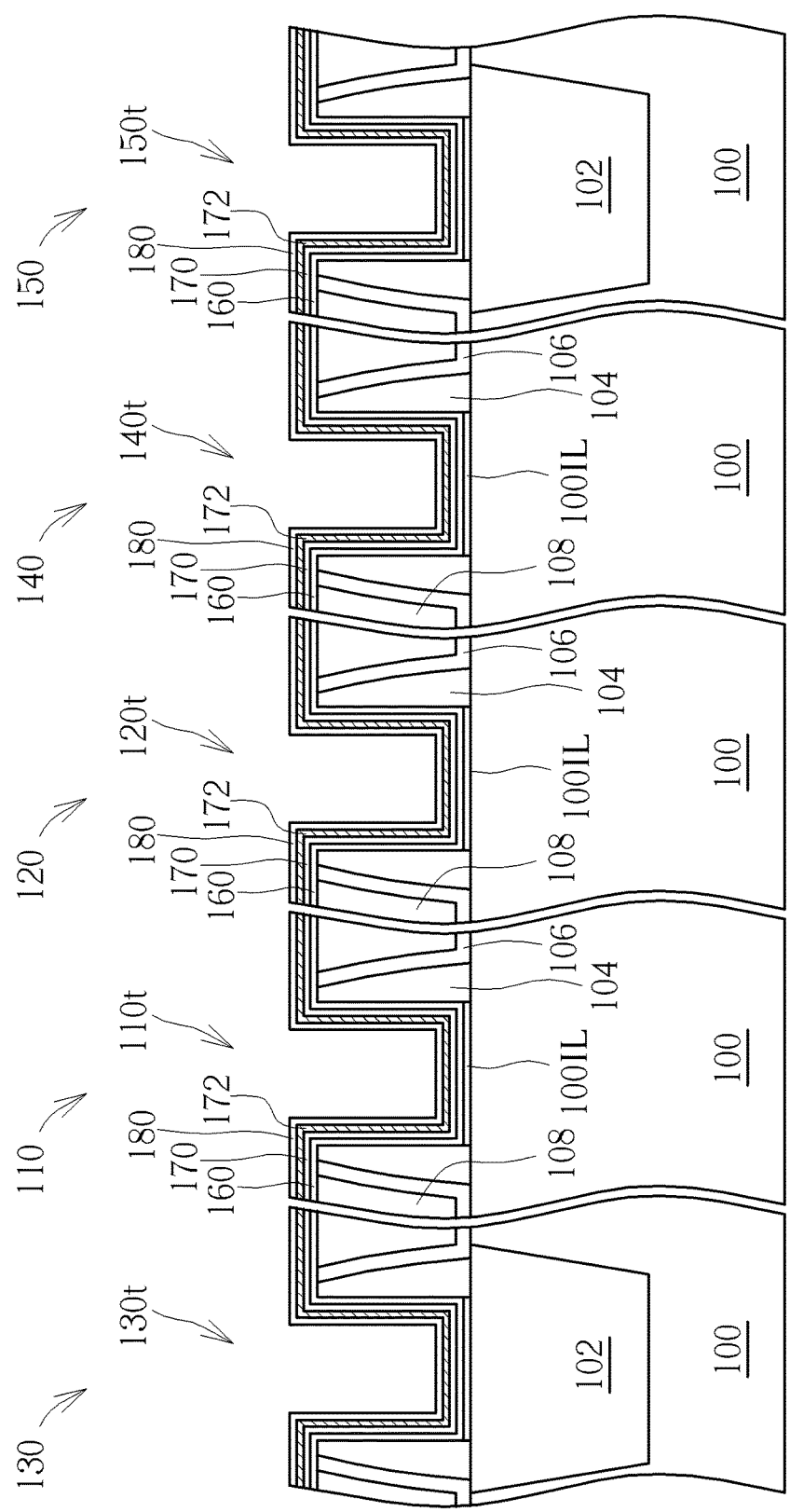

Please refer to FIG. 2. Next, a first p-work function metal layer 180 is formed in the first gate trench 110t, the second gate trench 120t, the third gate trench 130t, the fourth gate trench 140t, and the fifth gate trench 150t. The first p-work function metal layer 180 can include any suitable metal material having a work function between about 4.8 eV and about 5.2 eV such as TiN, TaN, titanium carbide (TiC), tantalum carbide (TaC), tungsten carbide (WC), or aluminum titanium nitride (TiAlN), but not limited to this. Preferably, the first p-work function metal layer 180 includes TiN. A thickness of the first p-work function metal layer 180 can be between 10 Å and 20 Å, but not limited to this.

Figure 3:
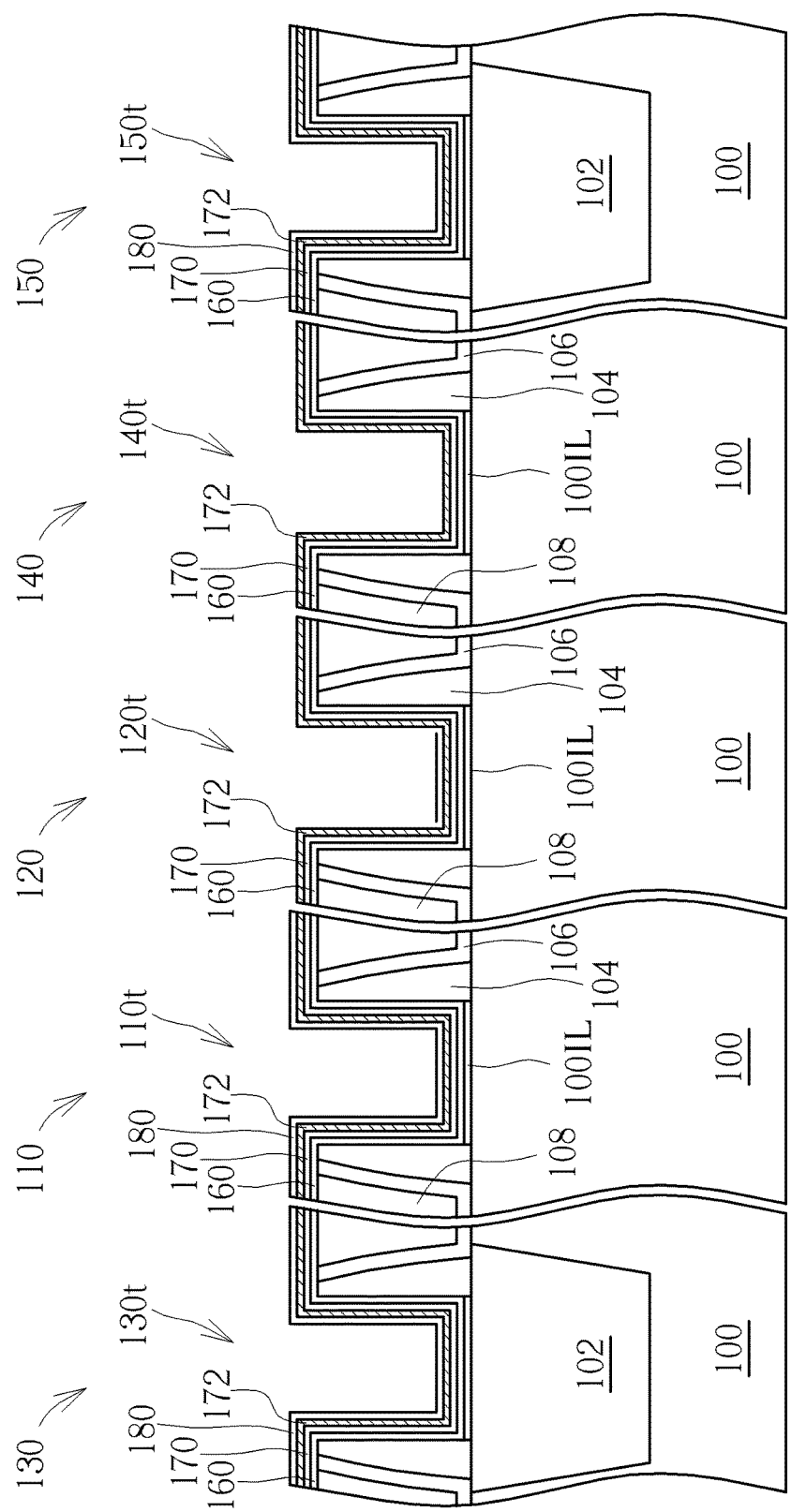

Please refer to FIG. 3. After forming the first p-work function metal layer 180, a patterned mask layer (not shown) is formed on the substrate 100. The patterned mask layer covers and protects the first nFET device 110, the third nFET device 130 and the second pFET device 150 while the second nFET device 120 and the first pFET device 140 are exposed by the patterned mask layer. Subsequently, an etching process is performed to remove the first p-work function metal layer 180 from the second gate trench 120*t* and the fourth gate trench 140*t* with the patterned mask layer serving as an etching mask. It is noteworthy that though the first pFET device 140 and the second pFET device 150 include the same conductivity type, the two pFET devices require different threshold voltages. It has been known that by adjusting the thickness of the work function metal layer, the threshold voltage can be altered. Therefore, the first p-work function metal layer 180 is removed from the fourth gate trench 140*t* (that is the first pFET device 140) to comply its threshold voltage requirement.

Figure 4:
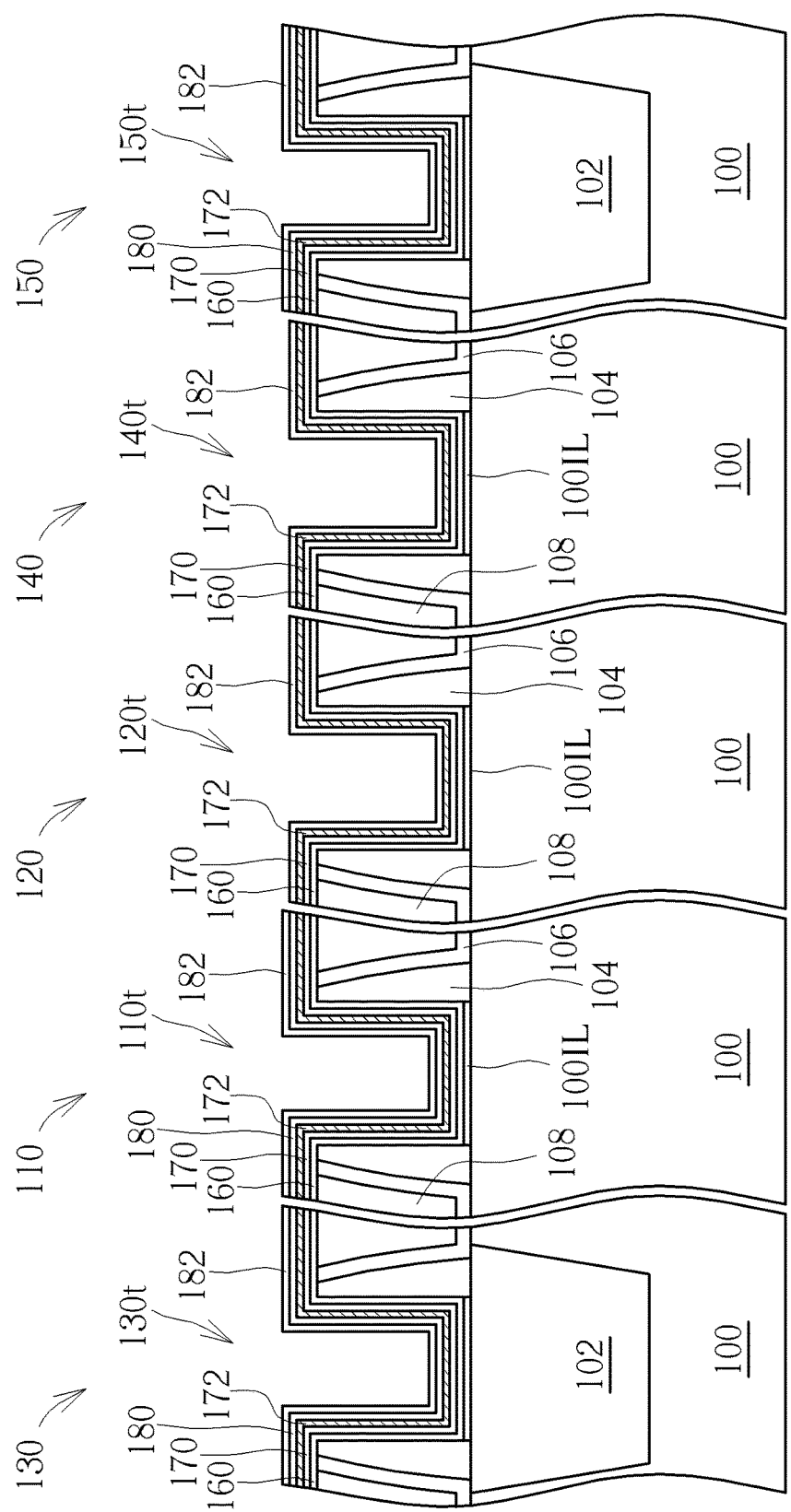

Please refer to FIG. 4. After removing the first p-work function metal layer 180 from the second gate trench 120*t* and the fourth gate trench 140*t*, a second p-work function metal layer 182 is formed in the first gate trench 110*t*, the second gate trench 120*t*, the third gate trench 130*t*, the fourth gate trench 140*t*, and the fifth gate trench 150*t*. As mentioned above, the second p-work function metal layer 182 can include any suitable metal material having a work function between about 4.8 eV and about 5.2 eV, and thus those detailed are omitted in the interest of brevity. In the preferred embodiment, for example but not limited to, the second p-work function metal layer 182 preferably includes TiN, which is the same with the first p-work function metal layer 180. And a thickness of the second p-work function metal layer 182 can be between 10 Å and 20 Å, but not limited to this.

Figure 5:
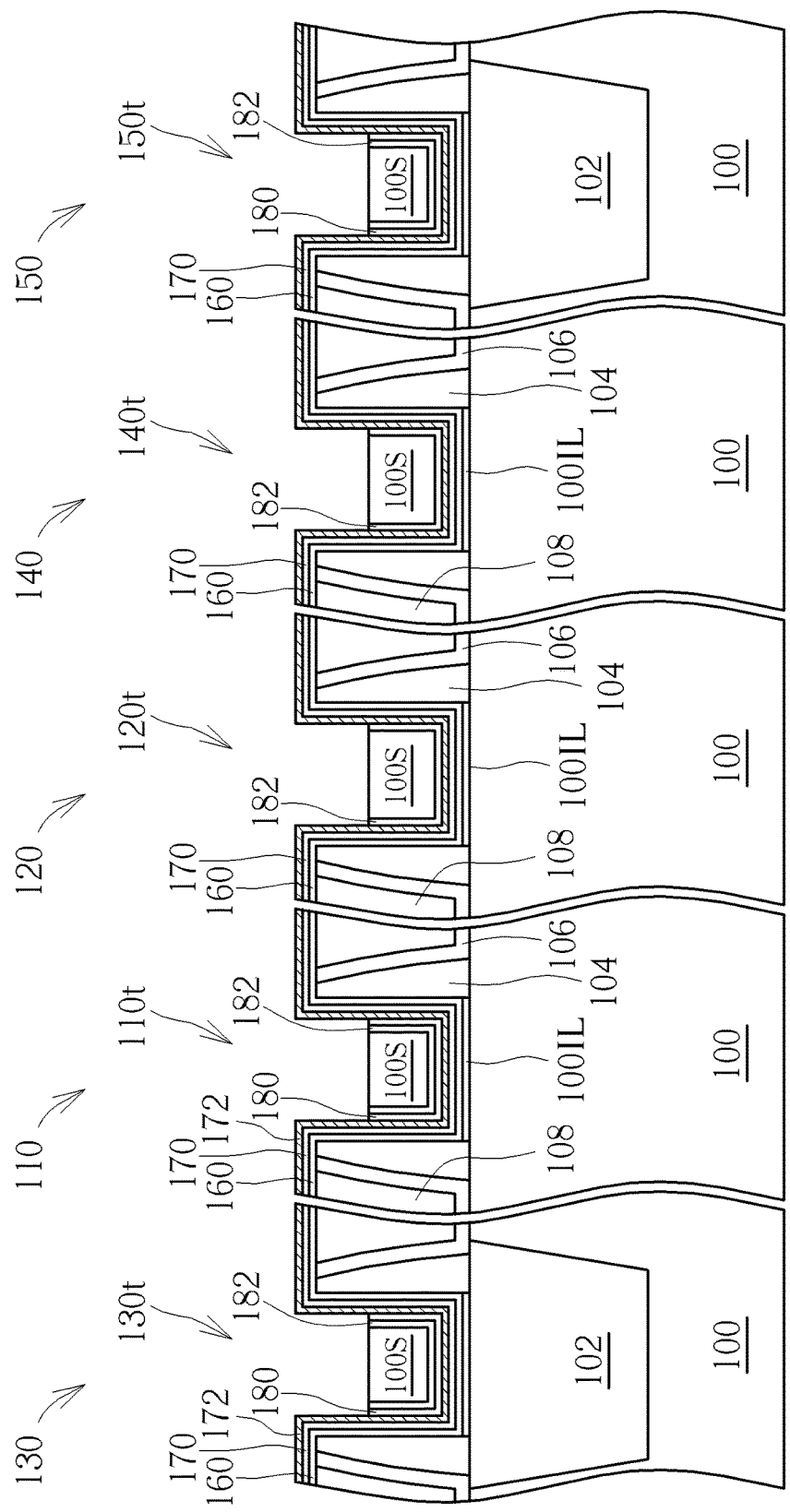

Please refer to FIG. 5. After forming the second p-work function metal layer 182, a sacrificial masking layer 100S is formed on the substrate 100. The sacrificial masking layer 100S is a layer have superior gap-filling characteristic such as a bottom anti-reflective coating (BARC) layer, a polysilicon layer, a Si-rich layer with silicon dangling bond (SHB) lower than 43%, a spin-on glass (SOG) layer, a sacrificial light absorbing material (SLAM) layer, or an oxide-rich layer such as DUO™ (manufacturing by Honeywell Electronic Materials), but not limited to this. Additionally, though the sacrificial masking layer 100S is a single-layered structure as shown in FIG. 5, the sacrificial masking layer 100S can be a multi-layered structure. Next, an etch back process is performed to remove portions of the sacrificial masking layer 100S such that a surface of the sacrificial masking layer 100S is lower than openings of the gate trenches 110*t*-150*t*. As shown in FIG. 5, those gate trenches 110*t*-150*t* are not filled up by the sacrificial masking layer 100S but bottoms of those gate trenches 110*t*-150*t* are still protected by the sacrificial masking layer 100S after the etching back process.

Please still refer to FIG. 5. Then, an etching process is performed with the sacrificial masking layer 100S serving as an etching mask. Consequently, portions of the first p-work function metal layer 180 and portions of the second p-work function metal layer 182 are removed from the first gate trench 110*t*, the third gate trench 130*t*, and the fifth gate trench 150*t*. Simultaneously, portions of the second p-work function metal layer 182 are removed from the second gate trench 120*t* and the fourth gate trench 140*t*. Therefore topmost portions of the first p-work function metal layer 180 and the second p-work function metal layer 182 are all lower than the openings of the first gate trench 110*t*, the third gate trench 130*t*, and the fifth gate trench 150*t*, and topmost portions of the second p-work function metal layer 182 are lower than the openings of the second gate trench 120*t* and the fourth gate trench 140*t*. In other words, the p-work function metal layers 180, 182 in the gate trenches 110*t*-150*t* are pulled down. It should be understood that the sacrificial masking layer 100S provided by the preferred embodiment is to define positions of the topmost portions of the first p-work function metal layer 180 and the second p-work function metal layer 182 in the gate trenches 110*t*-150*t*. It is also noteworthy that since the topmost portions of the first p-work function metal layer 180 and the second p-work function metal layer 182 are pulled down to be lower than the openings of the gate trenches 110*t*-150*t*, aspect ratios of the gate trenches 110*t*-150*t* are reduced and thus layers subsequently formed can be able to fill the gate trenches 110*t*-150 more successfully and smoothly.

Figure 6:
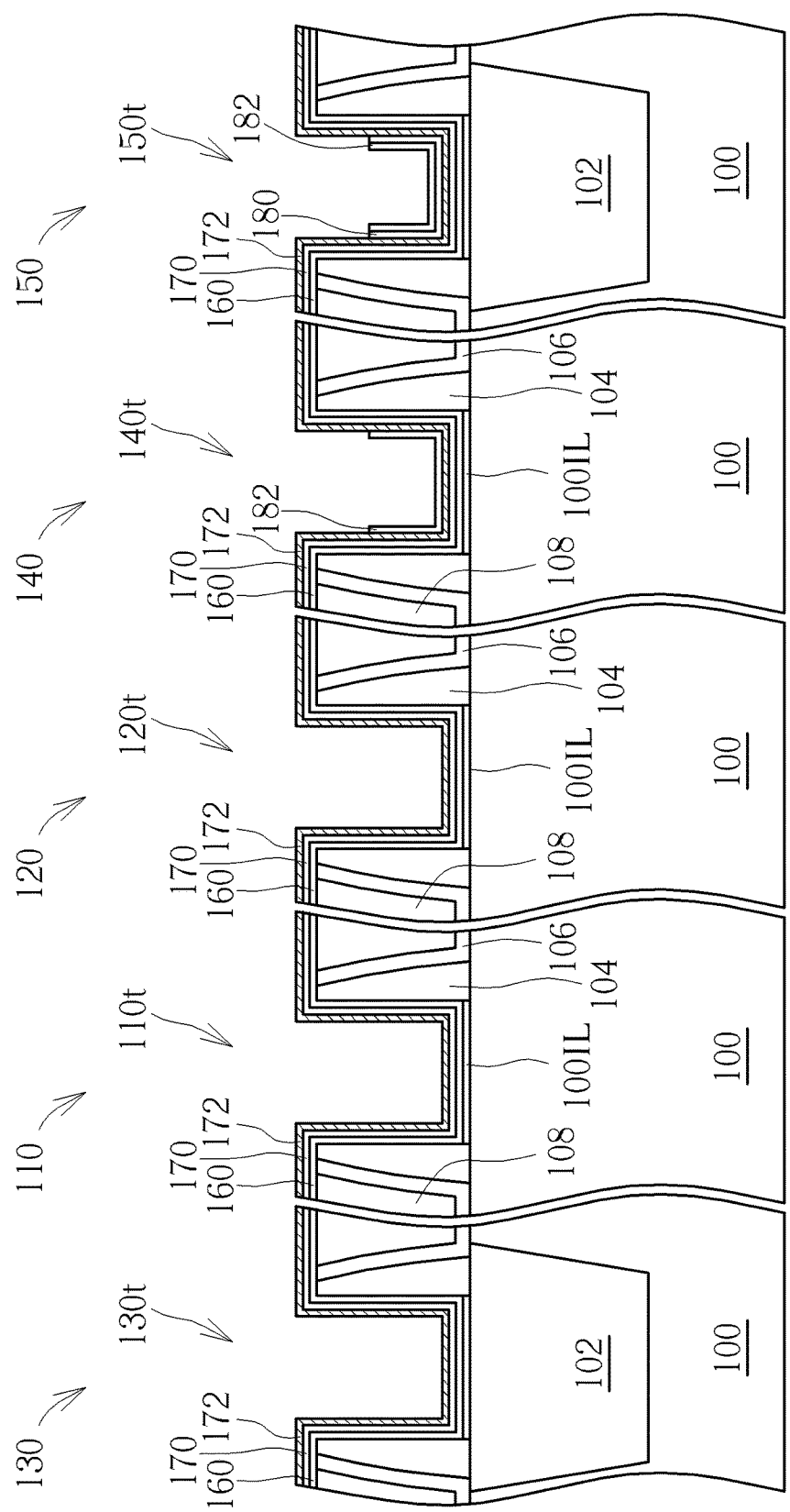

Please refer to FIG. 6. Next, the sacrificial masking layer 100S is removed and another pattern mask layer (not shown) is formed on the substrate 100. The patterned mask layer covers and protects the first pFET device 140 and the second pFET device 150, and to expose the first nFET device 110, the second nFET device 120 and the third nFET device 130. An etching process is subsequently performed to remove the first p-work function metal layer 180 and the second p-work function metal layer 182 from the first gate trench 110*t* and the third gate trench 130*t*. Simultaneously, the second p-work function metal layer 182 is removed from the second gate trench 120*t*. The patterned mask layer is then removed. As shown in FIG. 6, the first p-work function metal layer 180 remains only in the fifth gate trench 150*t* after the etching process while the second p-work function metal layer 182 remain in both of the fourth gate trench 140*t* and the fifth gate trench 140*t*.

Figure 7:
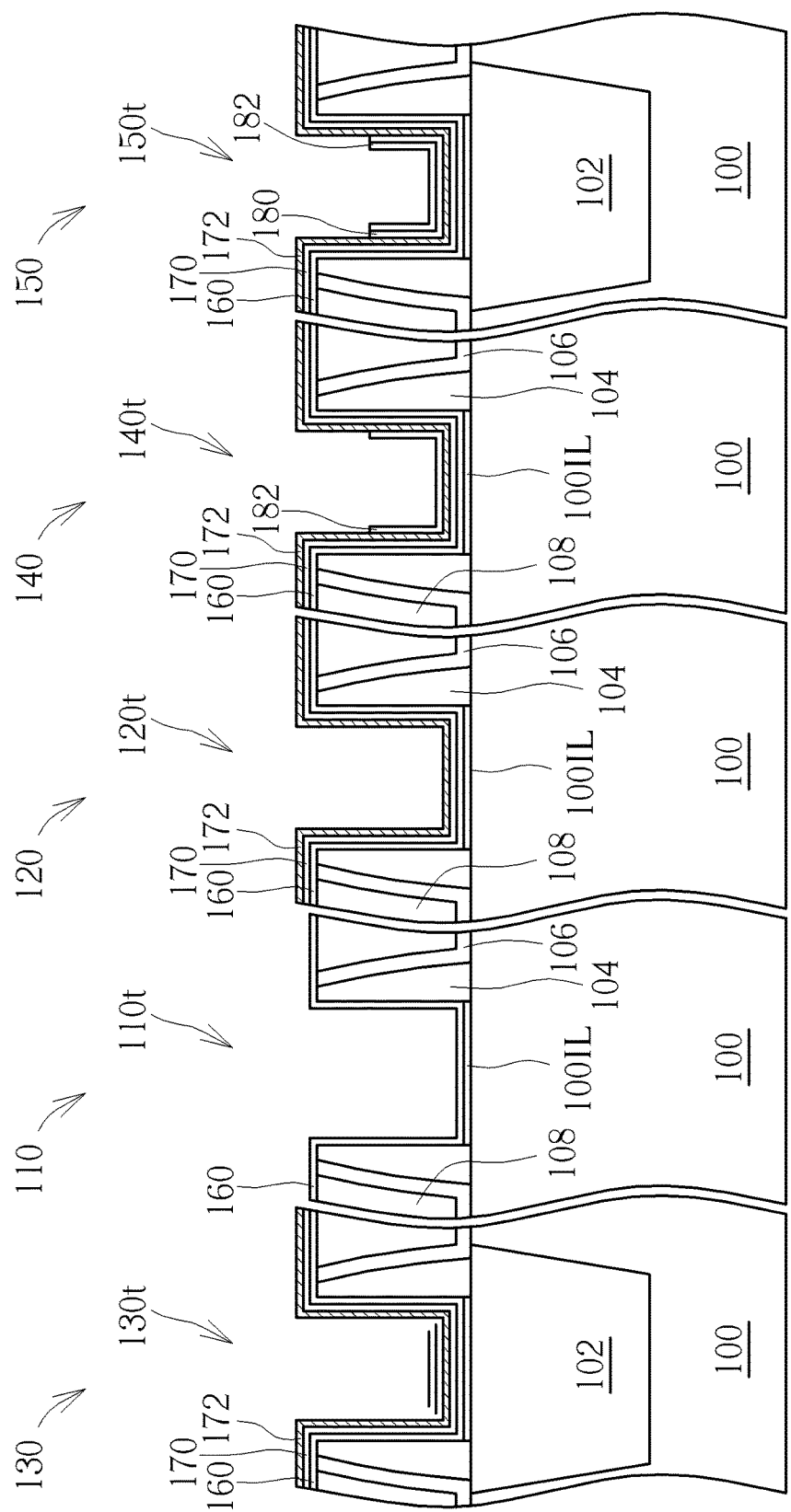

Please refer to FIG. 7. Next, another patterned mask layer (not shown) is formed on the substrate 100. The patterned mask layer covers and protects the second nFET device 120, the third nFET device 130, the first pFET device 140, and the second pFET device 150 while the first nFET device 110 is exposed. An etching process is then performed with the patterned mask serving as an etching mask. Consequently, the second bottom barrier layer 172 and the first bottom barrier layer 170 are removed from the first gate trench 110*t*.

Figure 8:
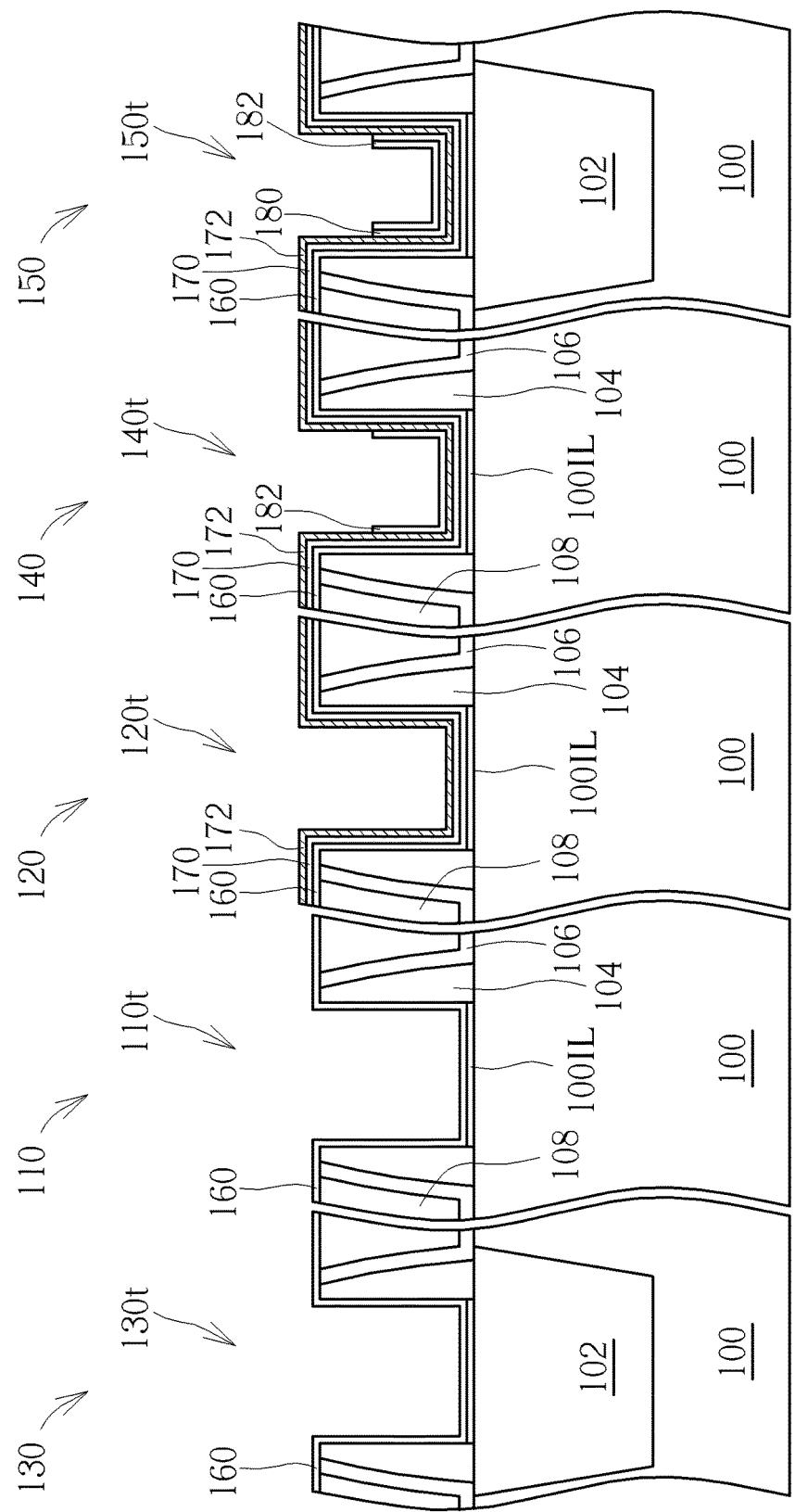

Please refer to FIG. 8, which is schematic drawing illustrating a modification to the preferred embodiment. In the modification, the patterned mask layer exposes not only the first nFET device 110, but also the third nFET device 130. Therefore, the second bottom barrier layer 172 and the first bottom barrier layer 170 in the first gate trench 110*t* and the third gate trench 130*t* are simultaneously removed, and thus the high-k gate dielectric layer 160 is exposed at bottoms of the first gate trench 110*t* and the third gate trench 130*t* as shown in FIG. 8 and followed by performing subsequent steps.

Figure 9:
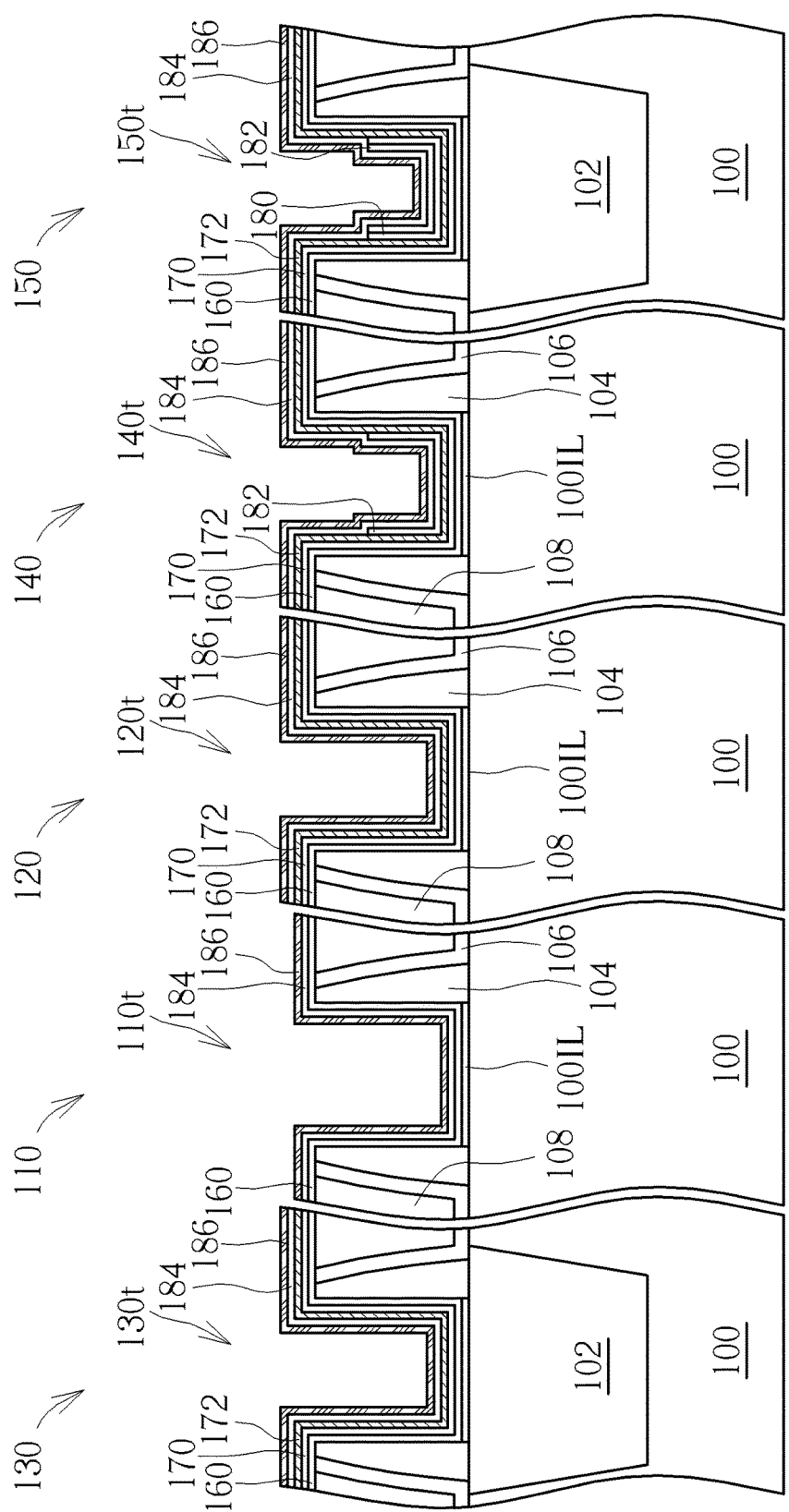

Please refer to FIG. 9. After removing the second bottom barrier layer 172 and the first bottom barrier layer 170 from the first gate trench 110*t*, the patterned mask layer is removed and followed by in-situ forming a third p-work function metal layer 184 and an n-work function metal layer 186 in the first gate trench 110*t*, the second gate trench 120*t*, the third gate trench 130*t*, the fourth gate trench 140*t*, and the fifth gate trench 150*t*, sequentially. As mentioned above, the third p-work function metal layer 184 can include any suitable metal material having a work function between about 4.8 eV and about 5.2 eV, therefore those details are omitted for simplicity. For example but not limited to, the third p-work function metal layer 184 preferably includes the material the same with the first p-work function metal layer 180 and the second p-work function metal layer 182, that is TiN in the preferred embodiment. A thickness of the third p-work function metal layer 184 can be between 10 Å-20 Å, but not limited to this. The n-work function metal layer 186 can include any suitable metal material having a work function between about 3.9 eV and about 4.3 eV, such as TiAl, ZrAl, WAl, TaAl, or HfAl, but not limited to this. A thickness of the n-work function metal layer 186 can be between 20 Å and 60 Å, but not limited to this. Additionally, the n-work function metal layer 186 can include a single-layered structure or a multi-layered structure. It is noteworthy that in the preferred embodiment, the third p-work function metal layer 184 formed in the first gate trench 110*t* serves as a third bottom barrier layer 184 between the high-k gate dielectric layer 160 and the n-work function metal layer 186. In other words, the third bottom barrier layer 184 in the first gate trench 110*t* and the third p-work function metal layer 184 in the second gate trench 120*t*, the third gate trench 130*t*, the fourth gate trench 140*t*, and the fifth gate trench 150*t* are simultaneously formed. And the third bottom barrier layer 184 and the third p-work function metal layer 184 include a same material.

As shown in FIG. 9, the n-work function metal layer 186 in the first gate trench 110*t* directly contacts the third bottom barrier layer 184 while the n-work function metal layer 186 in the second gate trench 120*t*, the third gate trench 130*t*, the fourth gate trench 140*t* and the fifth gate trench 150*t* directly contacts the third p-work function metal layer 184.

Figure 10:
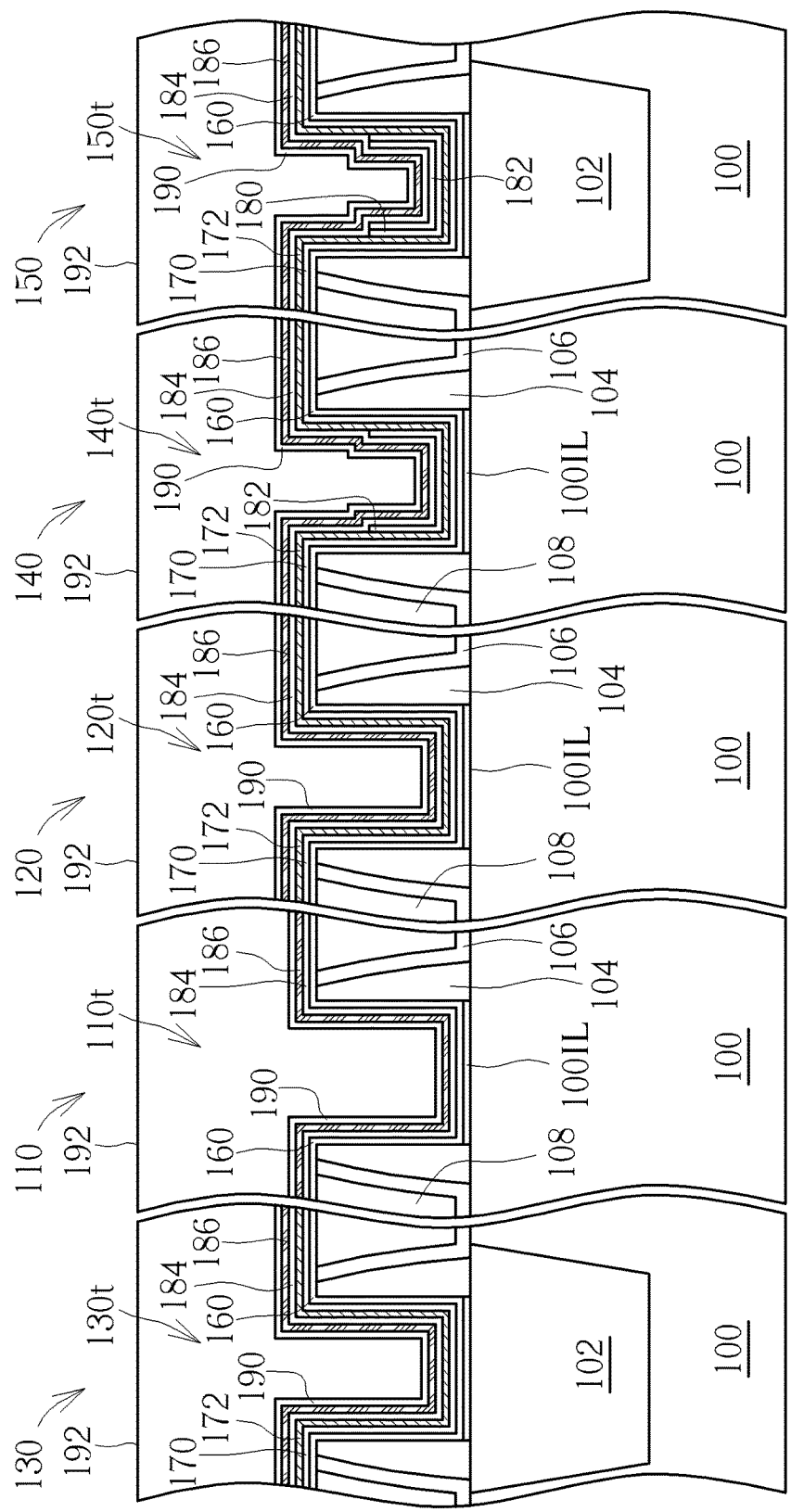

Please refer to FIG. 10. After forming the n-work function metal layer 186, a top barrier layer 190 and a filling metal layer 192 are formed in the first gate trench 110*t*, the second gate trench 120*t*, the third gate trench 130*t*, the fourth gate trench 140*t*, and the fifth gate trench 150*t*, sequentially. In the preferred embodiment, the top barrier layer 190 can include TiN, but not limited to this. A thickness of the top barrier layer 190 can be between 20 Å and 40 Å, but not limited to this. The filling metal layer 192 includes a single metal layer or a multiple metal layer including superior gap filing ability, such as Al, Ti, Ta, W, Nb, Mo, Cu, TiN, TiC, TaN, Ti/W, or Ti/TiN, but not limited to this.

Figure 11:
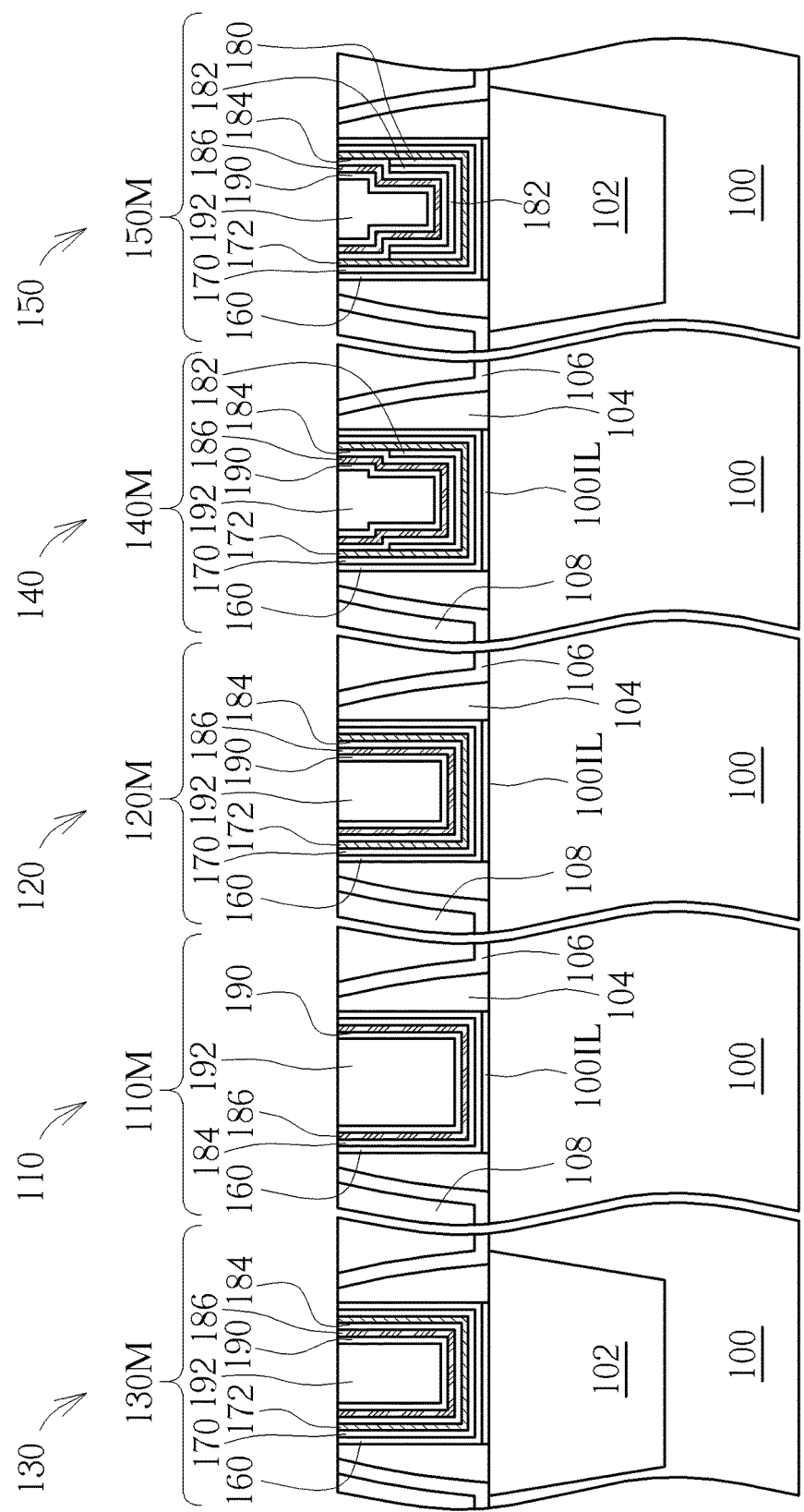

Please refer to FIG. 11. After forming the filling metal layer 192, a planarization process is performed to remove superfluous metals layer 192, 190, 186, 184, 172, 170 and high-k gate dielectric layer 160. Consequently, a first n-metal gate 110M is formed in the first nFET device 110, a second n-metal gate 120M is formed in the second nFET device 120, a third n-metal gate 130M is formed in the third nFET device 130, a first p-metal gate 140M is formed in the first pFET device 140, and a second p-metal gate 150M is formed in the second pFET device 150.

Please still refer to FIG. 11. It is concluded that the preferred embodiment provides integrated devices having metal gate. As shown in FIG. 11, in the first nFET device 110, the first n-metal gate 110M upwardly and sequentially includes the high-k gate dielectric layer 160, the third bottom barrier layer 184 including the material the same with the third p-work function metal layer 184, the n-work function metal layer 186 directly contacting the third bottom barrier layer 184, the top barrier layer 190, and the filling metal layer 192. That is, the high-k gate dielectric layer 160 is sandwiched between the third bottom barrier layer 184 and the substrate 100, and the third bottom barrier layer 184 directly contacts the high-k gate dielectric layer 160. It should be noted that since TaN renders more impacts to the threshold voltage of the n-metal gate, it makes the threshold voltage of the n-metal gate fail to be reduced. Therefore, the conventional TaN bottom barrier layer/etch stop layer is eliminated in accordance with the preferred embodiment. Thus the first n-metal gate 110M which requires low threshold voltage includes no TaN. More important, since the first n-metal gate 110M includes no TaN at all, the threshold voltage of the first n-metal gate 110M can be completely and successfully altered by adjusting the thickness of the n-work function metal layer 186. Compared to the conventional n-metal gate including TaN layer, the thickness of the n-work function metal layer 186 in the first n-metal gate 110M. of the preferred embodiment is reduced to 20%-40%, and thus target low threshold voltage can be achieved.

Please still refer to FIG. 11. In the second nFET device 120 and the third nFET device 130, the second n-metal gate 120M and the third n-metal gate 130M upwardly and sequentially include the high-k gate dielectric layer 160, the first bottom barrier layer 170, the second bottom barrier layer 172, the third p-work function metal layer 184 including the material the same with the third bottom barrier layer 184, the n-work function metal layer 186, the top barrier layer 190, and the filling metal layer 192. That is, the high-k gate dielectric layer 160 is sandwiched between the first bottom barrier layer 170 and the substrate 100, the second bottom barrier layer 172 is sandwiched between the third p-work function metal layer 184 and the first bottom barrier layer 170, and the third p-work function metal layer 184 is sandwiched between the second bottom barrier layer 172 and the n-work function metal layer 186. Since the second nFET device 120 requires higher threshold voltage, the first bottom barrier layer 170 and the second bottom barrier layer 172 including TaN are remained in the second n-metal gate 120M.

Please still refer to FIG. 11. In the first pFET device 140, the first p-metal gate 140M upwardly and sequentially includes the high-k gate dielectric layer 160, the first bottom barrier layer 170, the second bottom barrier layer 172, the second p-work function metal layer 182, the third p-work function metal layer 184 including the material the same with the third bottom barrier layer 184, the n-work function metal layer 186, the top barrier layer 190, and the filling metal layer 192. That is, the high-k gate dielectric layer 160 is sandwiched between the first bottom barrier layer 170 and the substrate 100, the second bottom barrier layer 172 is sandwiched between the first bottom barrier layer 170 and the second p-work function metal layer 182, and the second p-work function metal layer 182 is sandwiched between the second bottom barrier layer 172 and the third p-work function metal layer 184. In the second pFET device 150, the second p-metal gate 150M upwardly and sequentially includes the high-k gate dielectric layer 160, the first bottom barrier layer 170, the second bottom barrier layer 172, the first p-work function metal layer 180, the second p-work function metal layer 182, the third p-work function metal layer 184 including the material the same with the third bottom barrier layer 184, the n-work function metal layer 186, the top barrier layer 190, and the filling metal layer 192. That is, the high-k gate dielectric layer 160 is sandwiched between the first bottom barrier layer 170 and the substrate 100, the second bottom barrier layer 172 is sandwiched between the first bottom barrier layer 170 and the first p-work function metal layer 180, and the first p-work function metal layer 180 is sandwiched between the second bottom barrier layer 172 and the second p-work function metal layer 182. It is therefore understood that the threshold voltages of the first pFET device 140 and the second pFET device 150 can be altered by providing p-work function metal layer with different thickness: The thickness of the p-work function metal layer in the first pFET device 140 is a sum of the second p-work function metal layer 182 and the third p-work function metal layer 184 while the thickness of the p-work function metal layer in the second pFET device 140 is a sum of the first p-work function metal layer 180, the second p-work function metal layer 182, and the third p-work function metal layer 184. Therefore the thickness of the p-work function metal layer in the second pFET device 150 is larger than the thickness of the p-work function metal layer in the first pFET device 140, and thus the second pFET device 150 obtains higher threshold voltage. It is noteworthy that since the thickness of the n-work function metal layer 186 in the first p-metal gate 140M and the second p-metal gate 150M is reduced, the gap-filling result of the top barrier layer 190 and the filling metal layer 192 is improved.

Figure 12:
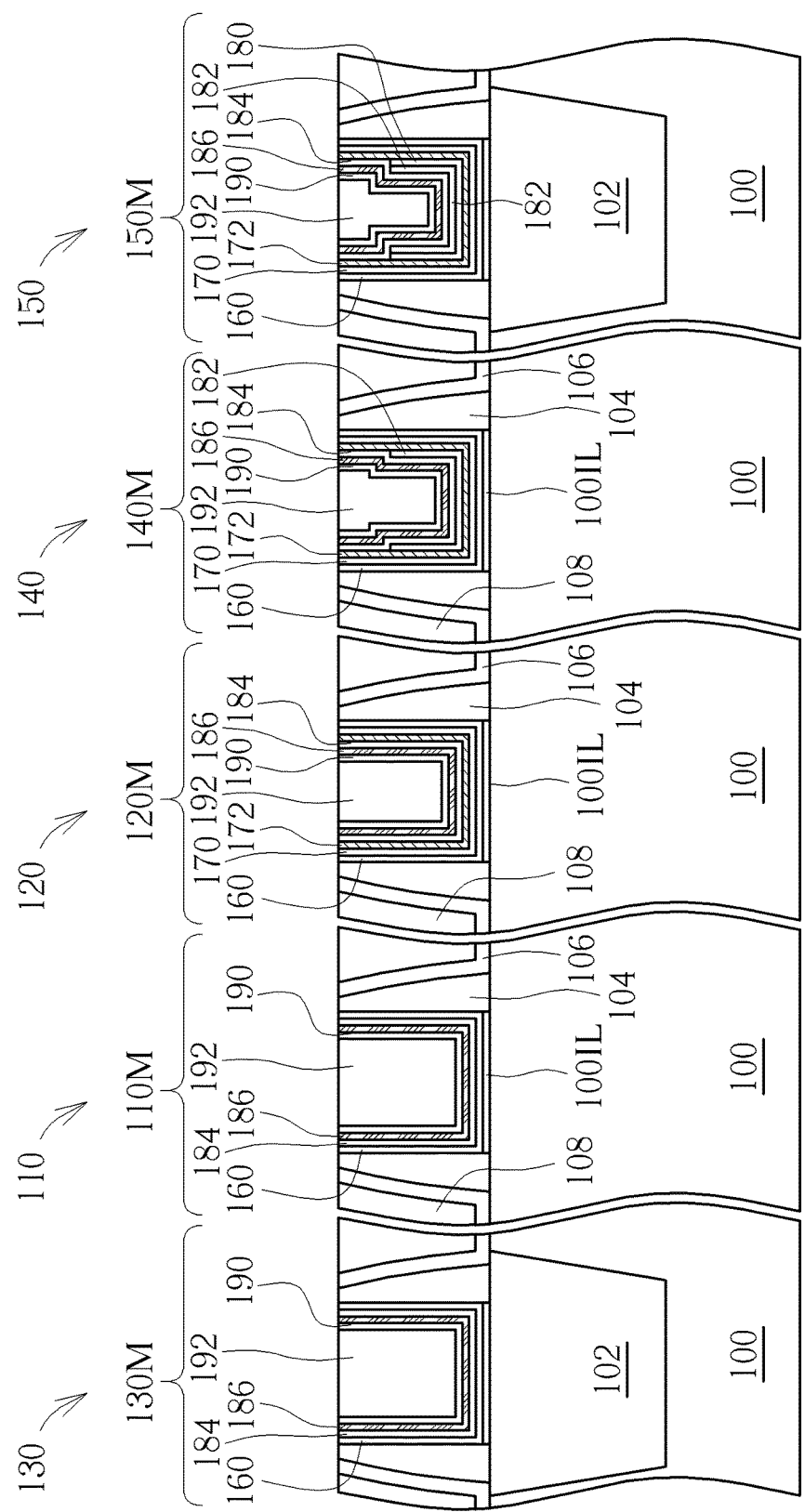

Please refer to FIG. 12, which is a schematic drawing illustrating the modification in a step subsequent to FIG. 8. As shown in FIG. 12, after removing the second bottom barrier layer 172 and the first bottom barrier layer 170 from the third gate trench 130t, the aspect ratio of the third gate trench 130t is reduced and thus gap-filling result of the third bottom barrier layer 184, the n-work function metal layer 186, the top barrier layer 190, and the filling metal layer 192 is improved. Also, as shown in FIG. 12, the third n-metal gate 130M upwardly and sequentially includes the high-k gate dielectric layer 160, the third bottom barrier layer 184 including the material the same with the third p-work function metal layer 184, the n-work function metal layer 186 directly contacting the third bottom barrier layer 184, the top barrier layer 190, and the filling metal layer 192. It is noteworthy that in the modification, the third n-metal gate 130M includes no second bottom barrier layer 172 and first bottom barrier layer 170, therefore the third bottom barrier layer 184 including the material the same with the third p-work function metal layer 184 directly contacts the high-k gate dielectric layer 160.

It is noteworthy that in the preferred embodiment, the TiN layer is referred to as the third p-work function metal layer in other nFET/pFET device serves as the bottom barrier layer in the nFET device of low threshold voltage. In other words, the bottom barrier layer of the nFET device of low threshold voltage includes the material the same with the p-work function metal layer formed last in other nFET/pFET devices. Additionally speaking, the threshold voltages of the FET devices can be altered not only by adjusting the n-/p-work function metal layers association and/or by adjusting the thickness of the n-/p-work function metal layers, but also by performing ion implantation and/or by adjusting a thickness of the gate dielectric layer.

More important, the preferred embodiment provides at least three types of n-metal gates: the first n-metal gate 110M including no TaN in the active region, the second n-metal gate 120M including TaN in the active region, and the third n-metal gate 130M including TaN on the isolation structure 102.

According to the semiconductors having metal gate and manufacturing method thereof provided by the present invention, different metal layers are associated to provide different threshold voltages for FET devices of the same conductivity type and thus requirement for different functions is complied. Furthermore, the semiconductor devices having metal gate and manufacturing method thereof provided by the present invention can be integrated with not only planar FET device fabrication process but also non-planar FET device fabrication process. Briefly speaking, the semiconductors having metal gate and manufacturing method thereof provided by the present invention is able to improve functionalities and performances without increasing process complexity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing semiconductor devices having metal gate, comprising:
providing a substrate comprising a plurality of isolation structures formed therein, and a first nFET device, a second nFET device, a third nFET device, a first pFET device and a second pFET device being formed on the substrate, wherein the first nFET device comprising a first gate trench and the second nFET comprising a second gate trench, and the third nFET device comprising a third gate trench and the first pFET device comprising a fourth gate trench and the second pFET device comprising a fifth gate trench;
sequentially forming a second bottom barrier layer and a third bottom barrier layer in the first gate trench, the second gate trench, the third gate trench, the fourth gate trench, and the fifth gate trench;
forming a second p-work function metal layer in the fifth gate trench;
forming a third p-work function metal layer in the fourth gate trench and the fifth gate trench;
removing the second bottom barrier layer and the third bottom barrier layer from the first gate trench;
after removing the second bottom barrier layer and the third bottom barrier layer, simultaneously forming a first bottom barrier layer in the first gate trench and a first p-work function metal layer in the second gate trench, the first bottom barrier layer and the first p-work function metal layer comprising a same material; and
forming an n-work function metal layer in the first gate trench and the second gate trench, the n-work function metal layer in the first gate trench directly contacting the first bottom barrier layer and the n-work function metal layer in the second gate trench directly contacting the first p-work function metal layer.

2. The method for manufacturing the semiconductor devices having metal gate according to claim 1, wherein the first bottom barrier layer and the first p-work function metal layer comprise TiN.

3. The method for manufacturing the semiconductor devices having metal gate according to claim 1, wherein the second bottom barrier layer comprises TiN and the third bottom barrier layer comprises TaN.

4. The method for manufacturing the semiconductor devices having metal gate according to claim 1, further comprising:
forming the second p-work function metal layer in the first gate trench, the second gate trench, the third gate trench, the fourth gate trench, and the fifth gate trench; and
removing the second p-work function metal layer from the second gate trench and the fourth gate trench.

5. The method for manufacturing the semiconductor devices having metal gate according to claim 4, further comprising:

forming the third p-work function metal layer in the first gate trench, the second gate trench, the third gate trench, the fourth gate trench, and the fifth gate trench; and removing the third p-work function metal layer from the first gate trench, the second gate trench and the third gate trench.

6. The method for manufacturing the semiconductor devices having metal gate according to claim 5, further comprising removing the second p-work function metal layer and the third p-work function metal layer from the first gate trench and third gate trench, and simultaneously removing the third p-work function metal layer from the first gate trench.

7. The method for manufacturing the semiconductor devices having metal gate according to claim 6, further comprising removing the second bottom barrier layer and the third bottom barrier layer from the third gate trench simultaneously with removing the second bottom barrier layer and the third bottom barrier layer from the first gate trench.

8. The method for manufacturing the semiconductor devices having metal gate according to claim 1, further comprising removing a portion of the third p-work function metal layer from the fourth gate trench, and a portion of the second p-work function metal layer and a portion of the third p-work function metal layer from the fifth gate trench, such that topmost portions of the third p-work function metal layer is lower than an opening of the fourth gate trench and topmost portions of the second p-work function metal layer and the third p-work function metal layer are lower than an opening of the fifth gate trench.

* * * * *